United States Patent
Thiagarajan et al.

(10) Patent No.: US 8,203,384 B1
(45) Date of Patent: Jun. 19, 2012

(54) AMPLIFIER

(75) Inventors: Krishnaswamy Thiagarajan, Bangalore (IN); Gireesh Rajendran, Bangalore (IN); Subhashish Mukherjee, Bangalore (IN); Apu Sivadas, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/019,112

(22) Filed: Feb. 1, 2011

(51) Int. Cl.
*H03F 3/45* (2006.01)

(52) U.S. Cl. .......................... 330/253; 330/154

(58) Field of Classification Search .................. 330/253, 330/252, 310, 98, 150, 154, 165, 195
See application file for complete search history.

(56) References Cited

U.S. PATENT DOCUMENTS

| | | | | |
|---|---|---|---|---|
| 3,938,024 A * | 2/1976 | Clarke | ............................ | 363/24 |
| 4,035,710 A * | 7/1977 | Joyce | ............................. | 363/37 |
| 4,307,440 A * | 12/1981 | Inoue et al. | ..................... | 363/15 |
| 6,111,460 A * | 8/2000 | Yamasita | ........................ | 330/69 |
| 7,737,788 B1 * | 6/2010 | Roo et al. | ...................... | 330/311 |
| 2004/0214547 A1 * | 10/2004 | Kim et al. | ..................... | 455/296 |
| 2006/0006950 A1 * | 1/2006 | Burns et al. | .................. | 330/311 |
| 2009/0224831 A1 | 9/2009 | Yao | | |

* cited by examiner

*Primary Examiner* — Henry Choe
(74) *Attorney, Agent, or Firm* — John R. Pessetto; W. James Brady; Frederick J. Telecky, Jr.

(57) ABSTRACT

An amplifier has first and second differential outputs connected to first and second ends of one side of a balun. A second side of the balun, inductively coupled to the first side of the balun, has a center tap that is electrically coupled to a conductive path to a power supply reference node for the amplifier.

12 Claims, 4 Drawing Sheets

AMPLIFIER

BACKGROUND

Active circuit elements and interconnects have some small inherent parasitic reactance (capacitive and/or inductive). In high frequency active circuits (for example, RF amplifiers), these unavoidable (and usually unwanted) reactances may cause the circuit to become unstable. In particular, the reactances may cause positive feedback at high frequencies, or may increase the impedance to a voltage reference at high frequencies, or may cause the real part of the impedance of an active circuit to become negative at high frequencies. Some circuit modifications to ensure stability in RF amplifiers result in decreased gain, or increased cost and complexity. There is an ongoing need for RE amplifiers with improved stability with little effect on gain and cost.

DETAILED DESCRIPTION

Figure 1A:
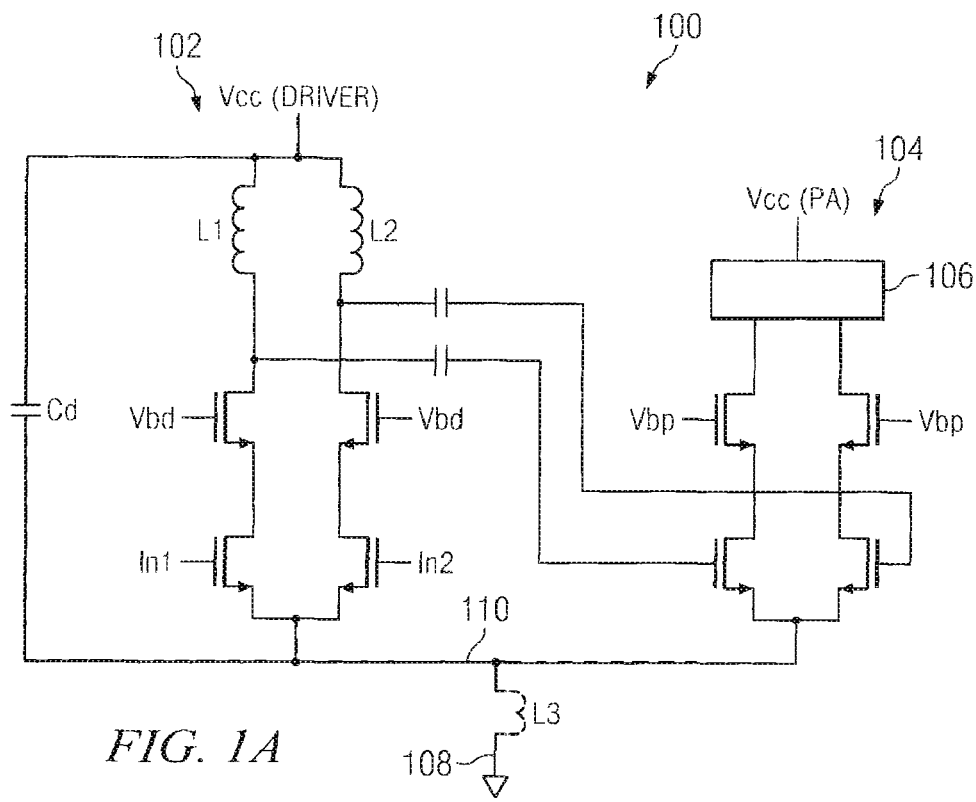
FIG. 1A is a schematic of an example amplifier circuit to illustrate potential instability.

FIG. 1A illustrates an example RF differential amplifier circuit 100. Circuit 100 has been simplified to facilitate illustration, and an operational circuit may include additional components and complexity. The example circuit 100 has at least a first stage 102 and a second stage 104. In the example circuit 100, the first stage 102 may be, for example, a driver or a mixer. The second stage 104 functions as a power or voltage amplifier. The first stage receives input signals In1 and In2. Voltage Vbd is a DC bias voltage for the driver stage. Alternatively, for the case in which the first stage 102 is a mixer, a local oscillator (LO) signal may be connected to the gates of the upper transistors instead of Vbd. Vcc (Driver) is a power supply connection for the first stage. Cd is a power supply bypass capacitor. The outputs of the first stage are coupled to inputs on the second stage. Voltage Vbp is a DC bias voltage for the power amplifier stage. Element 106 is the load for the power amplifier stage. Vcc (PA) is a power supply connection for the power amplifier stage. Element 108 is a connection to a shared external power supply reference node. The reference node may be a ground connection for Vcc (Driver) and Vcc (PA). Alternatively, circuit 100 may be powered by a positive voltage and a negative voltage, in which case element 108 may be a connection to a negative voltage. Inductors L1 and L2 are intentional circuit elements. In contrast, inductor L3 depicts an unintentional small parasitic reactance that is inherent to the interconnection (for example, a bonding wire, solder bump, solder ball, etc.) to the external power supply reference node.

The two stages of circuit 100 share a current path 110 to the external power supply reference node. This shared current path may contribute to common mode instability. The power amplifier stage 104 may have relatively large device parasitics (reactances). For high frequencies, the reactance of L3 along with the parasitic reactances of the power amplifier stage 104, L1, L2, and the power supply bypass capacitance Cd, may lead to a positive feedback loop being formed leading to common mode oscillations or instability.

Figure 1B:
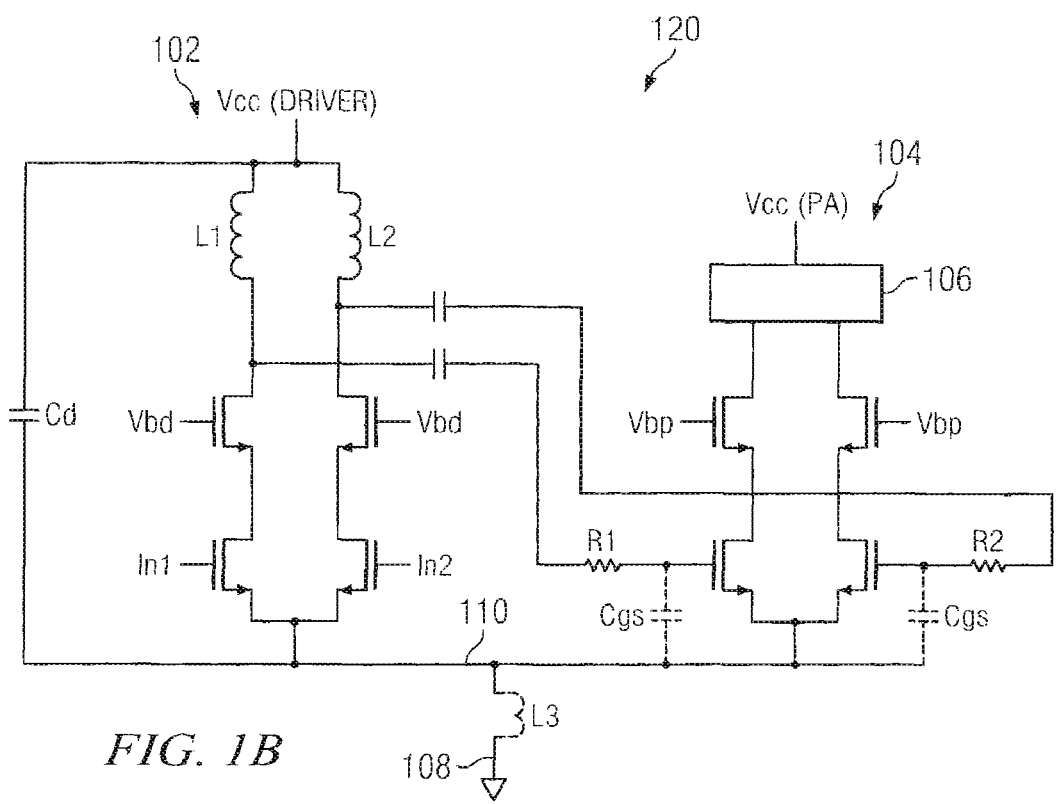
FIG. 1B is a schematic of the circuit of FIG. 1A with an example modification for improved stability.

FIG. 1B illustrates an example modification of the circuit in FIG. 1A with improved stability. In FIG. 1B, for circuit 120, capacitance Cgs is a small unintentional inherent gate-source capacitance in the power amplifier stage. R1 and R2 are inserted in the traces leading to the gates in the power amplifier stage. R1 and R2 function as power loss elements. In addition, at high frequencies, R1 and R2 in conjunction with Cgs function as low-pass filters, reducing the magnitude of high frequency signals to the gates in the power amplifier stage. Given sufficiently large resistance values for R1 and R2, stability is improved, but at the expense of high frequency gain.

Figure 1C:
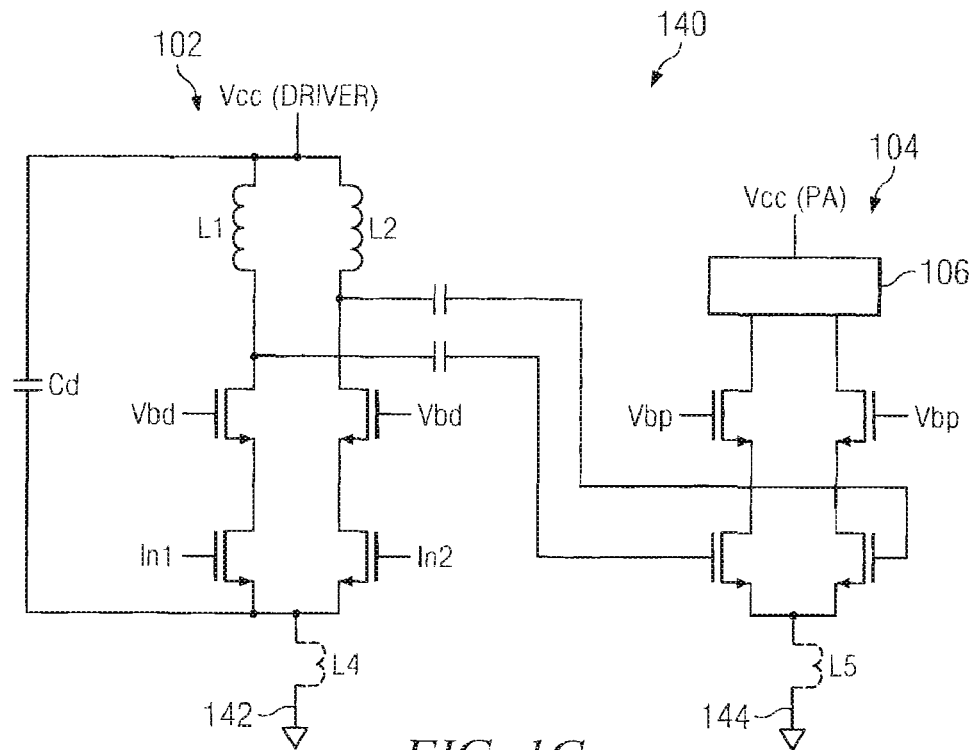
FIG. 1C is a schematic of the circuit of FIG. 1A with another example modification for improved stability.

FIG. 1C illustrates an alternative example modification of the circuit in FIG. 1A with improved stability. In FIG. 1C, a separate external connection (142, 144) is provided for each of the two stages to the power supply reference node. There is an inherent reactance L4 between the first stage 102 and the external reference node, and an inherent reactance L5 between the second stage 104 and the external reference node. Reactances L4 and L5 help isolate the first stage 102 from voltages resulting from high currents generated by the second stage 104, as well as eliminating a loop being formed due to L1, L2 and Cd.

Circuit 100 may represent a separate component or package with a few interconnections to external circuitry, or circuit 100 may be a part of a larger system with many interconnections to external circuitry. For either situation, package leads, solder balls, or other interconnections may be limited and needed for other interconnections, and it may be impractical to provide separate connections to an external reference node. In addition, each additional interconnection requires additional interconnection and traces in the external circuit (for example, a substrate on which circuit 100 is mounted), increasing system cost and complexity.

Figure 2:
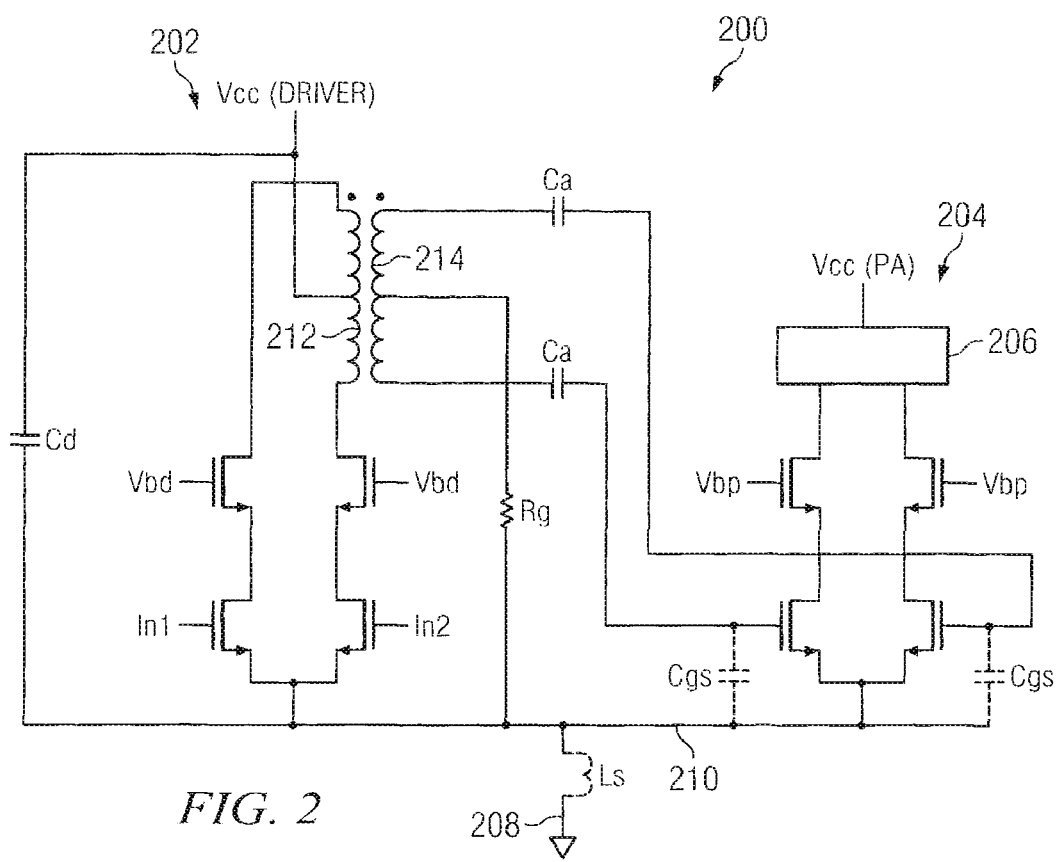
FIG. 2 is a schematic of an example embodiment of a circuit with improved stability.

FIG. 2 illustrates an example RF amplifier 200 with improved stability, but with little impact on bandwidth, and no requirement for an addition external connection. Amplifier 200 has at least a first stage 202 and a second stage 204. In the example amplifier 200, the first stage 202 may be, for example, a driver or a mixer. The second stage 204 functions as a power or voltage amplifier. The first stage receives input signals In1 and In2. Voltage Vbd is a DC bias voltage for the driver stage (or a LO signal in the case in which the first stage 202 is a mixer). Vcc (Driver) is a power supply connection for the first stage. Cd is a power supply bypass capacitor. Voltage Vbp is a DC bias voltage for the power amplifier stage. Element 206 is the load for the power amplifier stage. Vcc (PA) is a power supply connection for the power amplifier stage. Capacitance Cgs is a small unintentional inherent gate-source capacitance in the power amplifier stage. Element 208 is a shared connection to an external power supply reference node. Inductor Ls depicts an unintentional (parasitic) small reactance that is inherent to an interconnection (for example, a bonding wire, solder bump, solder ball, etc.). The two stages of circuit 200 share a current path 210 to the external reference node.

In the example circuit 200 of FIG. 2, L1 and L2 of FIG. 1 have been replaced by an inter-stage balun (212, 214). The outputs of the first stage are connected to each end of a first side 212 of the balun. A center tap on the first side 212 is connected to VCC (Driver). The inputs to the second stage are capacitively coupled (Ca) to the ends of the second side 214 of the balun. A center tap on the second side of the balun is resistively connected (Rg) to shared current path 210. The center tap on the second side of the balun is effectively the common-mode signal for the outputs of the first stage 202, and the resistive connection cancels much of the common mode voltage on the shared current path 210. The resistive connection does not affect differential-mode gain because Rg is connected to a virtual ground for differential signals. The balun and Rg eliminate the need for separate interconnections to the power supply reference node.

Figure 3:
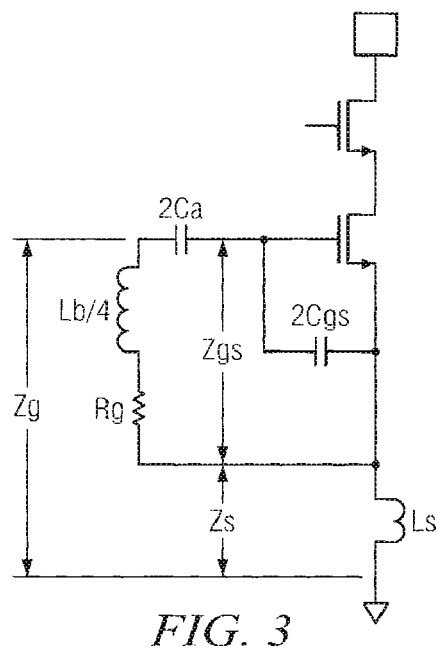
FIG. 3 is an equivalent circuit of the circuit of FIG. 2, for analyzing common mode stability, illustrating various impedances.

FIG. 3 illustrates an equivalent circuit of the second stage of the circuit of FIG. 2 for common mode impedance analysis, and in particular common mode stability analysis. In FIG. 3, Zg is the overall impedance of the inputs to the second stage, Zgs is the impedance between gate and source, Zs is the impedance of Ls (the inter-connect inductance), Lb is the inductance of one half of one side of the balun, and gm is the trans-conductance of the inputs of the second stage MOS transistors.

$$Zg = Zgs + Zs + gmZgsZs$$

$$Zs = sLs$$

If Zgs is inductive, then gmZgsZs becomes $s^2$ gmLgsLs, which is negative. Adding a sufficiently large Rg makes this term positive.

Figure 4A:
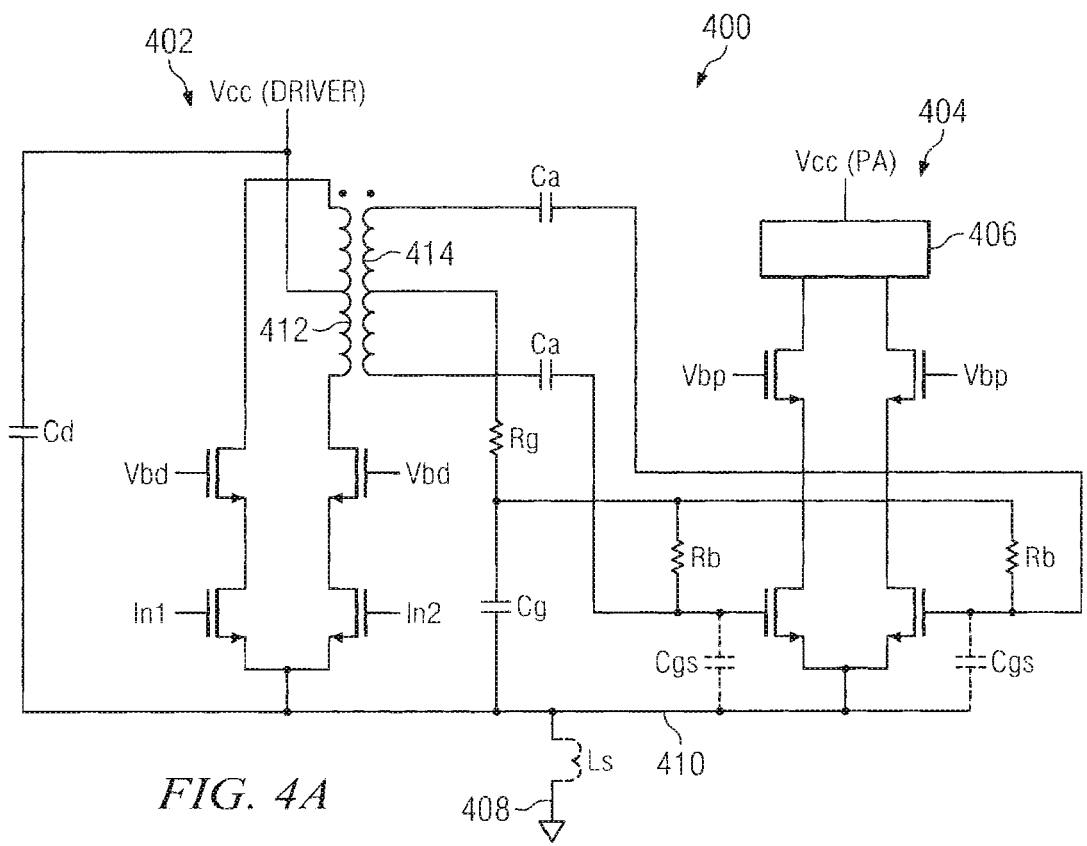
FIG. 4A is a schematic of an example embodiment of an alternative circuit with improved stability.

FIG. 4A illustrates an alternative RE amplifier 400 with improved stability, but with little impact on bandwidth, and no requirement for an addition external connection. Amplifier 400 has at least a first stage 402 and a second stage 404. In the example circuit 400, the first stage 402 may be, for example, a driver or a mixer. The second stage 404 functions as a power or voltage amplifier. The first stage receives input signals In1 and In2. Voltage Vbd is a DC bias voltage for the driver stage. Vcc (Driver) is a power supply connection for the first stage. Voltage Vbp is a DC bias voltage for the power amplifier stage (or may be a LO signal in the case in which the first stage 402 is a mixer). Element 406 is the load for the power amplifier stage. Vcc (PA) is a power supply connection for the power amplifier stage. Capacitance Cgs is a small unintentional inherent gate-source capacitance in the power amplifier stage. Element 408 is a shared connection to an external power supply reference node. Inductor Ls depicts an unintentional (parasitic) small reactance that is inherent to an interconnection (for example, a bonding wire, solder bump, solder ball, etc.). The two stages of circuit 400 share a current path 410 to the external reference node.

In the example circuit 400 of FIG. 4A, the outputs of the first stage are connected to each end of a first side 412 of a balun. A center tap on the first side 412 is connected to VCC (Driver). The inputs to the second stage are taken from the ends of the second side 414 of the balun. The inputs to the second stage may be capacitively coupled (Ca) to the ends of the balun, as illustrated, or may be directly coupled.

In FIG. 4A, a center tap on the second side 414 of the balun is resistively connected (Rg) to the gates of the second stage amplifier transistors. In addition, a capacitor Cg connects Rg to the shared current path 410. The center tap on the second side 414 of the balun is effectively the common-mode signal for the outputs of the first stage 402. The resistor Rg couples the inverted common mode signal onto the gates of the second stage amplifier transistors. At high frequencies, Cg is effectively a short to the shared current path 410, so at high frequencies the resistor Rg also couples the inverted common-mode signal onto the common return path 410. Therefore, at high frequencies, resistor Rg couples some compensating common mode signal to both the gates and the sources of the second stage amplifier transistors.

At high frequencies, Cg is effectively a short to the shared current path 410. Therefore, at high frequencies, the equivalent circuit for common mode impedances and stability analysis will be identical to FIG. 3, which is a stable structure. The resistive connection does not affect differential-mode gain because Rg is connected to a virtual ground for differential signals. In addition, the balun and Rg eliminate the need for separate interconnections to the power supply reference node.

Figure 4B:
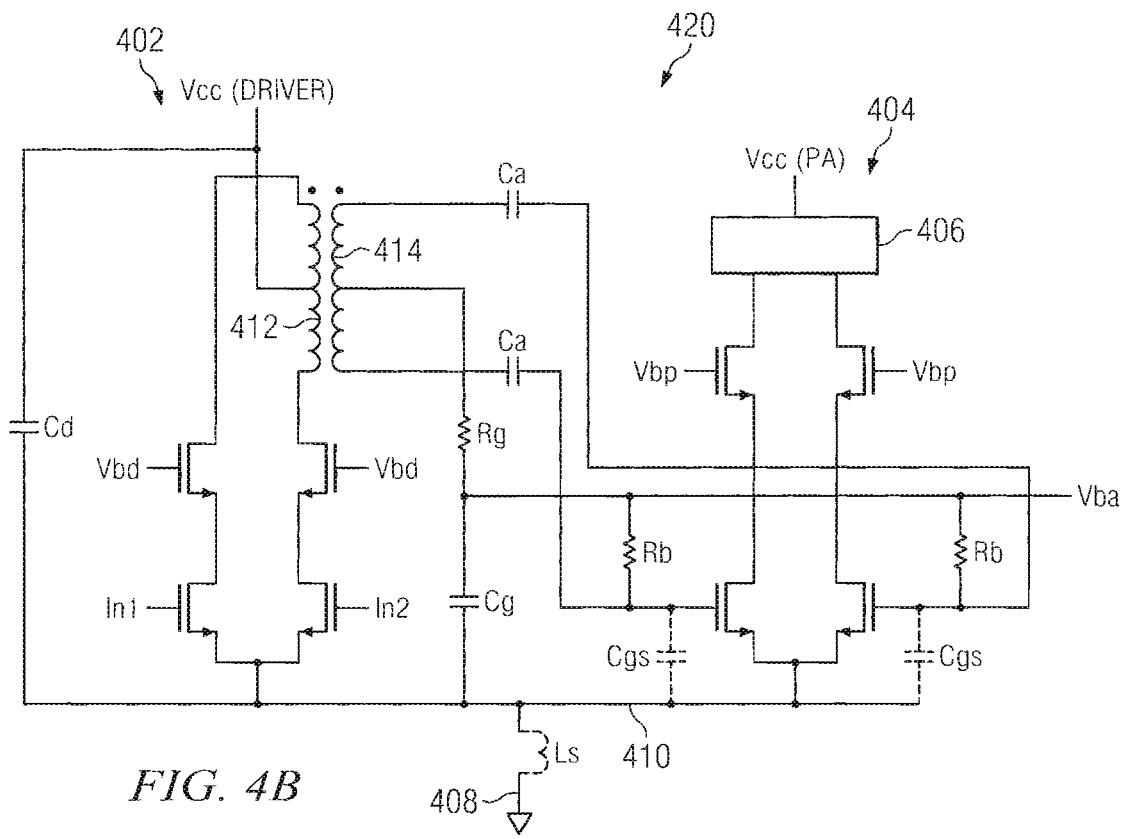
FIG. 4B is a schematic of an example embodiment of a variation of the circuit of FIG. 4A.

In general, the current through a MOS transistor, as a function of the gate-source voltage, is non-linear. Typically, the gate-to-source voltage is provided with a DC bias to place the transistor into a linear region, and input signals swing the gate-source voltage on either side of the bias voltage. For simplicity, in FIGS. 1A-1C and FIGS. 2-4, the bias circuitry for the second stage amplifier MOS transistors is not expressly illustrated. In the example of FIG. 4B, the second stage bias circuitry for the amplifier MOS transistors is expressly illustrated.

In FIG. 4B, amplifier 420 is a variation of amplifier 400 in FIG. 4A. In FIG. 4B, a bias voltage Vba is resistively connected to the gates of the amplifier MOS transistors. A center tap on the second side 414 of the balun is resistively connected (Rg) to the bias voltage Vba. In addition, the center tap is resistively connected to a capacitor Cg connecting to the shared current path 410. The center tap on the second side 414 of the balun is effectively the common-mode signal for the outputs of the first stage 402. The resistor Rg couples some inverted common mode signal onto the bias voltage Vba, which in turn couples to the gates of the second stage amplifier transistors. In addition, at high frequencies, Cg is effectively a short to the shared current path 410, so at high frequencies the resistor Rg also couples some inverted common-mode signal to the common return path 410. Therefore, at high frequencies, resistor Rg couples some compensating common mode signal to both the gates and the sources of the second stage amplifier transistors.

At high frequencies, Cg is effectively a short to the shared current path 410. Therefore, at high frequencies, the equivalent circuit for common mode impedances and stability analysis will be identical to FIG. 3, which is a stable structure. The resistive connection does not affect differential-mode gain because Rg is connected to a virtual ground from differential signals. In addition, the balun and Rg eliminate the need for separate interconnections to the power supply reference node.

In the example circuits illustrated in FIGS. 4A and 4B, the center tap of the second side of the balun is electrically coupled to the inputs of the second stage, and to the shared current path. Alternatively, the center tap of the second side of the balun could be just electrically coupled to the inputs of the second stage without coupling to the shared current path. Alternatively, the center tap of the second side of the balun could be resistively and capacitively (Rg, Cg) coupled to the shared current path without coupling to the inputs of the second stage.

Figure 5:
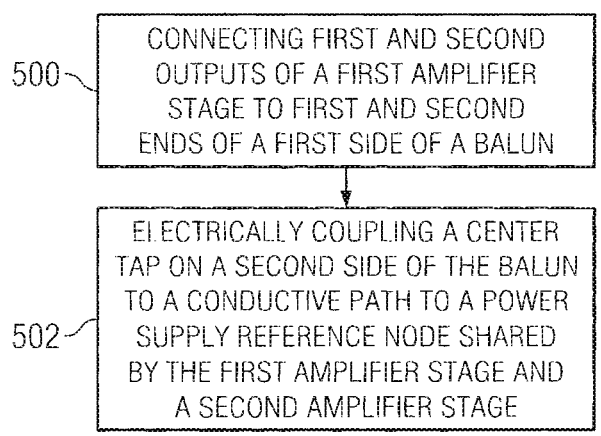
FIG. 5 is a flow chart of an example method for improving stability of an amplifier.

FIG. 5 illustrates an example method for improving stability of an amplifier. At step 500, first and second outputs of a first stage of an amplifier are electrically coupled to first and second ends of a first side of a balun. At step 502, a center tap of a second side of the balun is electrically coupled to a path to a power supply reference node shared by the first stage of the amplifier and by a second stage.

What is claimed is:

1. An amplifier, comprising:
    at least a first stage and a second stage, each stage connected to a shared conductive path to a power supply reference node;
    first and second differential outputs in the first stage connected to first and second ends of a first side of a balun;
    a second side of the balun, inductively coupled to the first side of the balun, having a center tap electrically coupled to the shared conductive path to the power supply reference node; and
    first and second differential inputs to the second stage electrically coupled to first and second ends of the second side of the balun.

2. The amplifier of claim 1, further comprising: the first and second differential inputs to the second stage capacitively coupled to the first and second ends of the second side of the balun.

3. The amplifier of claim 1, further comprising: the first and second differential inputs to the second stage directly coupled to the first and second ends of the second side of the balun.

4. The amplifier of claim 1, further comprising: the center tap on the second side of the balun resistively coupled to first and second differential inputs to the second stage.

5. The amplifier of claim 4, further comprising: a resistor connected to the center tap on the second side of the balun, and a capacitive coupling between the resistor and the shared conductive path to the power supply reference node.

6. The amplifier of claim 1, further comprising: first and second differential inputs to the second stage resistively connected to a bias voltage, and the center tap on the second side of the balun resistively connected to the bias voltage.

7. The amplifier of claim 6, further comprising: a capacitive coupling between the bias voltage and the shared conductive path to the power supply reference node.

8. A method of stabilizing an amplifier, comprising:
    connecting first and second differential outputs of a first amplifier stage to first and second ends of a first side of a balun;
    electrically coupling a center tap of a second side of the balun, inductively coupled to the first side of the balun, to a conductive path to a power supply reference node shared by the first amplifier stage and a second amplifier stage;
    resistively connecting first and second ends of the second side of the balun to first and second differential inputs to the second amplifier stage.

9. The method of claim 8, further comprising: directly connecting first and second ends of the second side of the balun to first and second differential inputs to the second amplifier stage.

10. The method of claim 8, further comprising: electrically coupling the center tap on the second side of the balun to first and second differential inputs to the second amplifier stage.

11. The method of claim 8, further comprising: resistively connecting first and second differential inputs to the second amplifier stage to a bias voltage, and resistively connecting the center tap on the second side of the balun to the bias voltage.

12. The method of claim 11, further comprising: capacitively coupling the bias voltage to the shared conductive path to the power supply reference node.

* * * * *